(12) United States Patent
Heikkinen et al.

(10) Patent No.: US 11,069,649 B2
(45) Date of Patent: Jul. 20, 2021

(54) LASER ASSISTED SOLDER BONDING OF DIRECT CONVERSION COMPOUND SEMICONDUCTOR DETECTOR

(71) Applicant: DETECTION TECHNOLOGY OY, Oulu (FI)

(72) Inventors: Petteri Heikkinen, Oulu (FI); Mikael Johansson, Oulu (FI)

(73) Assignee: Detection Technology Oy, Oulu (FI)

( * ) Notice: Subject to any disclaimer, the term of this patent is extended or adjusted under 35 U.S.C. 154(b) by 29 days.

(21) Appl. No.: 16/478,676

(22) PCT Filed: Jan. 25, 2018

(86) PCT No.: PCT/EP2018/051765
§ 371 (c)(1),
(2) Date: Jul. 17, 2019

(87) PCT Pub. No.: WO2018/138174
PCT Pub. Date: Aug. 2, 2018

(65) Prior Publication Data
US 2019/0378815 A1    Dec. 12, 2019

(30) Foreign Application Priority Data

Jan. 27, 2017  (EP) .................................... 17153476

(51) Int. Cl.
*H01L 23/00* (2006.01)
*H01L 27/146* (2006.01)
*B23K 1/005* (2006.01)

(52) U.S. Cl.
CPC ............ *H01L 24/81* (2013.01); *B23K 1/0056* (2013.01); *H01L 24/11* (2013.01); *H01L 24/14* (2013.01);
(Continued)

(58) Field of Classification Search
CPC ......... H01L 24/81; H01L 24/11; H01L 24/14; H01L 24/16; H01L 24/92;
(Continued)

(56) References Cited

U.S. PATENT DOCUMENTS 9,916,989 B2 * 3/2018 Yoon ................... H01L 21/4853
9,966,409 B2 * 5/2018 Danzer ............. H01L 27/14661
(Continued)

FOREIGN PATENT DOCUMENTS

DE            44 46 289 A1     6/1996
DE       10 2008 050838 A1    10/2009
JP           2007 214271 A     8/2007

OTHER PUBLICATIONS

International Search Report and Written Opinion for Application No. PCT/EP2018/051765 dated May 11, 2018, 14 pages.
(Continued)

*Primary Examiner* — Cuong B Nguyen
(74) *Attorney, Agent, or Firm* — Alston & Bird LLP

(57) ABSTRACT

In an embodiment, a method comprises: configuring a direct conversion compound semiconductor sensor over a first surface of a readout integrated circuit, IC, comprising two surfaces, each surface comprising solder material on the surface; illuminating the solder material with an infra-red laser such that the solder material on the readout IC melts and forms solder joints between the readout IC and the direct conversion compound semiconductor sensor; configuring a substrate over a second surface of the readout IC comprising solder material; and illuminating the solder material of the second surface with the infra-red laser such that the solder material on the readout IC melts and electrically connects the readout IC with the substrate. In other embodiments, a high frequency radiation detector and an imaging apparatus are discussed.

9 Claims, 5 Drawing Sheets

(52) U.S. Cl.
CPC .............. *H01L 24/16* (2013.01); *H01L 24/92* (2013.01); *H01L 27/1469* (2013.01); *H01L 27/14636* (2013.01); *H01L 27/14661* (2013.01); *H01L 2224/0401* (2013.01); *H01L 2224/1403* (2013.01); *H01L 2224/16227* (2013.01); *H01L 2224/81224* (2013.01); *H01L 2224/81801* (2013.01); *H01L 2924/014* (2013.01); *H05K 2201/10734* (2013.01)

(58) Field of Classification Search
CPC ......... H01L 27/14636; H01L 27/14661; H01L 27/1469; H01L 2224/0401; H01L 2224/1403; H01L 2224/16227; H01L 2224/81224; H01L 2224/81801; H01L 2924/014; H01L 2224/11312; H01L 2224/11318; H01L 2224/131; H01L 2224/13111; H01L 2224/14181; H01L 2224/16145; H01L 2224/81191; H01L 2224/81192; H01L 2224/81201; H01L 2224/81815; H01L 2224/81986; H01L 2224/9202; H01L 2224/05569; H05K 2201/10734; B23K 1/0056

See application file for complete search history.

(56) References Cited

U.S. PATENT DOCUMENTS

| | | |
|---|---|---|
| 2007/0037318 A1 | 2/2007 | Kim |
| 2016/0015339 A1 | 1/2016 | Danzer et al. |

OTHER PUBLICATIONS

International Preliminary Report on Patentability (Chapter II) for Application No. PCT/EP2018/051765 dated Apr. 18, 2019, 16 pages.

Extended Search Report for European Application No. 17153476.1 dated Aug. 17, 2011, 12 pages.

Mei, Z. et al., *Low-Temperature Solders*, Hewlett-Packard Journal, vol. 47, No. 1 (Aug. 1, 1996), 91-98.

Wickham, M. et al., *An Review of Electronics Materials Deposition Techniques Including Solder Jetting and Relief Printing*, NPL Report MATC(A)92 (Apr. 2002) 41 pages.

* cited by examiner

LASER ASSISTED SOLDER BONDING OF DIRECT CONVERSION COMPOUND SEMICONDUCTOR DETECTOR

CROSS-REFERENCE TO RELATED APPLICATIONS

This application is a national phase entry of International Application No. PCT/EP2018/051765, filed Jan. 25, 2018, which claims priority to European Patent Application No. 17153476.1, filed on Jan. 27, 2017, the entire contents of which are incorporated herein by reference.

BACKGROUND

High frequency radiation detectors have a number of applications. They may be used, for example, in high energy radiation such as X-Ray detection and radiation from radioactive substances. X-Ray detectors are used in medical as well as security applications, while radioactive e radiation detectors are used in safety and military applications. There are different types of detectors, like scintillators, gas discharge detectors, and solid state detectors also referred to as direct conversion detectors. It is advantageous to have solid state detectors as they may provide ease of use, longer lifecycle, smaller size, higher resolution and sensitivity, and mobility which may not be possible with, for example, gas discharge based detectors. However, solid state detectors may be difficult to assemble. Commonly used semiconductors, for example silicon and germanium, when used as high frequency radiation detectors require cooling mechanisms to be able to operate. High frequency detectors comprising direct conversion compound semiconductor materials like Cadmium Telluride (CdTe) and Cadmium Zinc Telluride (CdZnTe) may be able to operate at room temperature.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a laser assisted solder bonding of direct conversion compound semiconductor detector. The object is achieved by the features of the independent claims. Some embodiments are described in the dependent claims. In an embodiment, a method comprises: configuring a direct conversion compound semiconductor sensor over a first surface of a readout integrated circuit, IC, comprising two surfaces, each surface comprising solder material on the surface; illuminating the solder material with an infra-red laser such that the solder material on the readout IC melts and forms solder joints between the readout IC and the direct conversion compound semiconductor sensor; configuring a substrate over a second surface of the readout IC comprising solder material; and illuminating the solder material of the second surface with the infra-red laser such that the solder material on the readout IC melts and electrically connects the readout IC with the substrate.

In other embodiments, a high frequency radiation detector and an imaging apparatus are discussed.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

Figure 1:
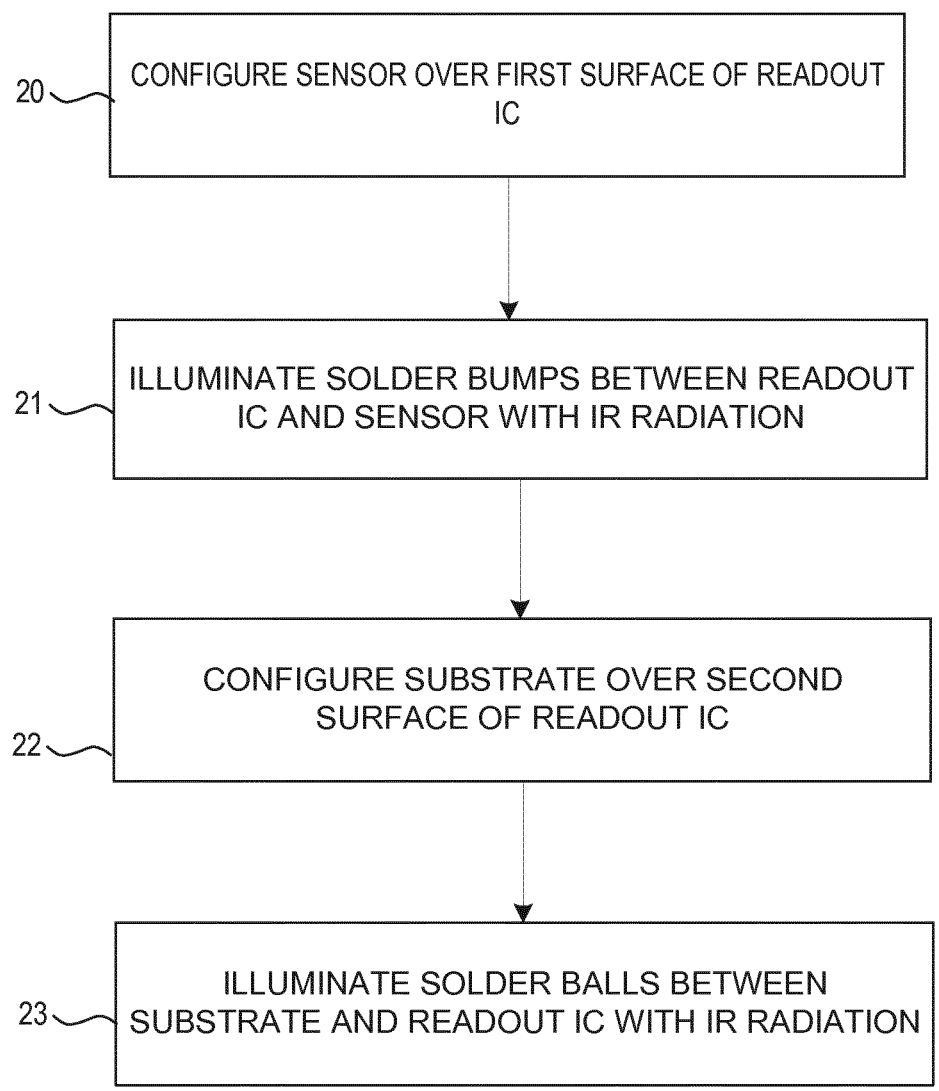
FIG. 1 illustrates a schematic flow chart of a method of soldering direct conversion compound semiconductor sensor, integrated circuit and substrate according to an embodiment.

The detailed description provided below in connection with the appended drawings is intended as a description of the embodiments and is not intended to represent the only forms in which the embodiment may be constructed or utilized. However, the same or equivalent functions and structures may be accomplished by different embodiments.

According to an embodiment, bonding process is done using a bond tool which has infrared, IR, laser. Radiation of the IR laser is emitted from top or bottom part of the detector assembly. The detector assembly comprises parts such as the direct conversion compound semiconductor sensor, a readout IC and a substrate. Short pulsed laser beam may heat up and reflow the solder alloy joints between the parts of the assembly, for example in less than one second. Direct conversion compound semiconductor materials are typically substantially transparent for IR wavelengths, thereby having low absorptions enabling low thermal load to material when IR laser heating is used. IR laser heats mainly solder alloy material very locally between the parts of the detector and for a very short time, thereby reducing thermal load to the direct conversion compound semiconductor materials and to the rest of the detector. Thermal load may be significantly reduced compared to typical mass reflow or thermal compression processes. The embodiment enables a possibility to use electronic industry standard high temperature solder alloys as the solder material, for example SAC alloys, having benefits such as: Availability of the fully automated equipment; standard metal alloy spheres commercially available even for fines pitch; standard equipment and metal alloy are cost effective. For example in some embodiments, the solder material may have a melting point higher than 150 degree Celsius. This may include solder materials standard lead free solder or eutectic SnPb solders.

Although the embodiments may be described and illustrated herein as being implemented in relation to direct conversion compound semiconductor detectors for detecting X-rays, this is only an example of a high frequency radiation detector and not a limitation. As those skilled in the art will appreciate, the present embodiments are suitable for application in a variety of different types of high frequency radiation detectors, for example for detecting gamma rays, for X-rays, for X-ray tomography, for security X-ray scanners etc. comprising various types of direct conversion compound semiconductor sensors based on, for example Cadmium Telluride (CdTe) or Cadmium Zinc Telluride (CdZnTe).

The operations of the manufacturing the tile described herein may be carried out in any suitable order, or simultaneously where appropriate. For example the direct conversion compound semiconductor sensor and the readout ID may be bonded first by the IR laser. Alternatively the process may begin by bonding the readout IC and the substrate by the IR laser. Furthermore, the IR laser may be emitted from below or under, for example from upwards or from downwards to the assembly to be manufactured, or sideways, in case the assembly is positioned vertically instead of the typical horizontal positioning.

FIG. 1 illustrates a schematic flowchart of a method of assembling a direct conversion compound semiconductor detector according to an embodiment. The method comprises of steps 20, 21, 22, and 23.

In step 20 a direct conversion compound semiconductor sensor (compound semiconductor sensor) is configured over a read out integrated circuit, IC. The direct conversion compound semiconductor sensor is made of direct conversion compound semiconductors like Cadmium Telluride (CdTe) or Cadmium Zinc Telluride (CdZnTe) and it comprises a top surface and a bottom surface. The direct conversion compound semiconductor sensor is configured to convert high frequency radiation like x-rays incident on its top surface directly into electrical signals transmittable via electrically conductive points, for example, pads on its bottom surface. The readout integrated circuit (IC) has two surfaces, a top surface and a bottom surface. According to an embodiment, the readout IC may be hardware logic components such as Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The top surface of the readout IC has electrical connection points on which solder material may be arranged. Pitch of the solder material so arranged, and the underlying connection points are matched with the pitch of the electrically conductive pads on the bottom surface of the direct conversion compound semiconductor sensor. The placement of direct conversion compound semiconductor sensor is done such that the conductive pads on the bottom surface of direct conversion compound semiconductor sensor contact the corresponding solder material on the readout IC. The direct conversion compound semiconductor sensor and the readout IC may be bonded by application of physical force. This may not be, however, necessary for some embodiments. The physical force applied is high enough to bond the solder material with the conductive pads on the bottom surface of the direct conversion compound semiconductor sensor, at least temporarily. The readout IC has circuitry necessary to convert the electrical signals from the direct conversion compound semiconductor sensor into a digital form, adding information including, for example, the location of the signal in a planar co-ordinate system. Further the readout IC has electrical connection points on is bottom surface, through which the digitized signals and information about them may be communicated with further circuitry. These electrical connections may be connected with the circuitry of the readout IC via silicon through vias from the top surface to the bottom surface. According to an embodiment, the solder balls may be configured on the connection points on the bottom of the readout IC, either before step 1 or after step 2

Step 21 includes illuminating the solder material between the direct conversion compound semiconductor sensor and the readout IC with an Infra-Red (IR) laser for a short duration of time. The wavelength of the IR laser is chosen such that the direct conversion compound semiconductor sensor and/or the readout IC is transparent to it. The duration for which the IR laser is turned on depends on the melting point of the solder between the direct conversion compound semiconductor sensor and the readout IC. The laser illuminates solder material for enough time to heat up and melt the solder material, which after cooling and solidifying forms electrical connections between the connection pads on the bottom surface of the direct conversion compound semiconductor sensor and the connection pads on the top surface of the readout IC.

According to an embodiment, the IR laser may be shone on the solder material from the bottom of the readout IC such that the IR passes through the readout IC before illuminating the solder material.

According to another embodiment, the IR laser may be shone on the solder material from the top surface of the direct conversion compound semiconductor sensor such that the IR passes through direct conversion compound semiconductor sensor before illuminating the solder material.

Step 22 includes configuring a substrate material having electrical connection pads corresponding to the solder balls on the bottom surface of the readout IC on the bottom side of the readout IC, matching the pads with the solder balls. The substrate may contain circuitry and wiring necessary to connect and transmit the digital signal from the readout IC to processing circuitry, for example for image forming. The configuration may further include bonding the substrate with the sensor and readout IC formed in step 21, by means of physical force.

Step 23 may include illuminating the solder balls between the readout IC and substrate with an IR laser for a duration sufficient to melt the solder material to from electrical connections between connection pads on the bottom surface of the readout IC and the connection pads on the substrate material.

According to an embodiment, the IR laser may be configured to illuminate the solder material between the readout IC and the substrate material such that it passes through the substrate material first, for example, the IR laser may be positioned facing the bottom surface of the substrate material.

According to another embodiment, the IR laser may be configured to illuminate the solder material between the readout IC and the substrate material such that it passes through the readout IC before reaching the solder material, for example, the IR laser may be positioned facing the top surface of direct conversion compound semiconductor sensor.

According to yet another embodiment, the order of configuring, bonding and illuminating with IR radiation of the direct conversion compound semiconductor sensor and substrate material with the readout IC may be changed along with the direction of illuminating IR radiation.

According to an embodiment, the solder material such as the solder alloy may be heated by the IR laser to a pre-set temperature.

The temperature may be monitored and adjusted by the IR laser fast by fast feedback loop.

Figure 2:
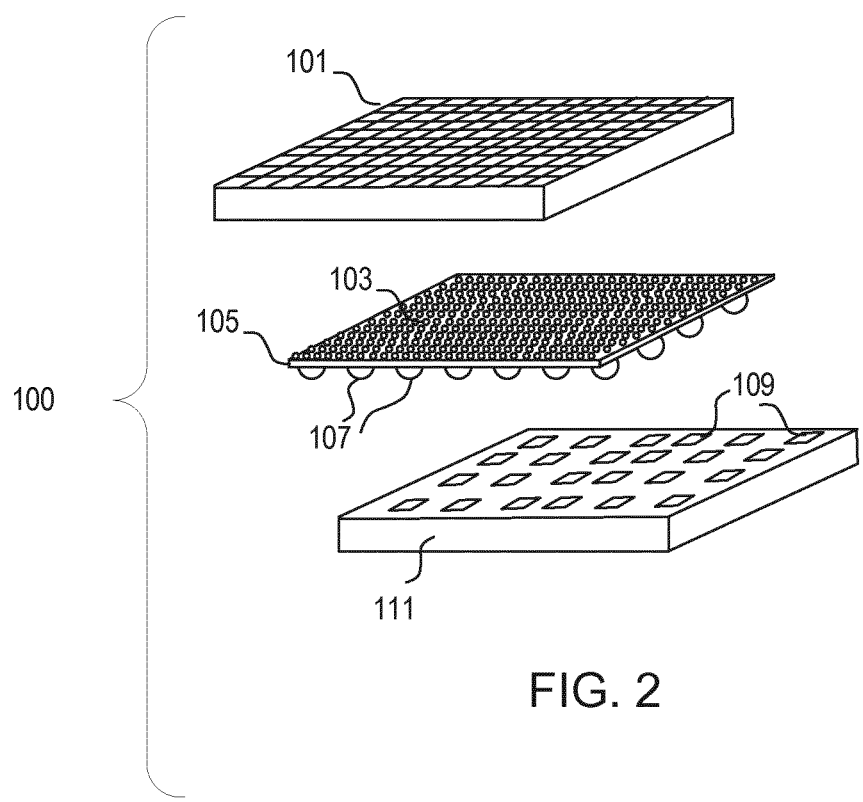
FIG. 2 illustrates a schematic representation of components of an individual direct conversion compound semiconductor detector according to an embodiment.

FIG. 2 illustrates components of an individual direct conversion compound semiconductor sensor detector 100 according to an embodiment. The individual direct conversion compound semiconductor sensor comprises a direct conversion compound semiconductor sensor 101, a readout IC 105 and a substrate material 111. The direct conversion compound semiconductor sensor 101 comprises electrical contact points, for example, in the form of conductive pads (not shown in FIG. 2) on its bottom surface to transmit electrical signals produced due to incident high frequency radiation. The readout IC 105 comprises two surfaces, the top surface is configured to interface with the bottom surface of the direct conversion compound semiconductor sensor 101 and the bottom surface of the read out IC 105 is configured to interface with the substrate material 111. The read out IC 105 comprises solder material 103 configured on its top surface, for example in the form of fine pitch solder spheres. These solder material 103 are positioned on top of electrical connection points of the readout IC 105 which are configured to receive electrical signals from the direct conversion compound semiconductor sensor 101. The readout IC 105 comprises circuitry configured to convert the electrical signals from direct conversion compound semiconductor sensor 101 to a digitized form, which may contain additional information, for example, location of the signal in an X-Y coordinate plane. The bottom surface of the readout IC 105 comprises electrical connection points configured to transmit the digitized signal for further processing to the substrate layer 111. The bottom surface of readout IC 105 may comprise a redistribution layer, wherein the electrical connection points are connected to the circuitry in readout layer by through silicon vias and conductive metal layers. On the electrical connection points on the bottom of the readout IC 105, solder material comprising a ball grid array 107 may be configured. The substrate material 111 electrical connection points on its surface corresponding to electrical connection points on the bottom surface of readout IC 105. These connection points may comprise electrical pads 109, connected to wiring and circuitry which forwards the digitized signals received from the readout IC 105 for further processing.

According to an embodiment, the solder material of ball grid array 107 may be configured on the substrate material 111 on corresponding electrical connection points 109 instead of the bottom side of the readout IC 105.

According to an embodiment, the solder material 103, 107 on the top and bottom surface of readout IC 105, or on top surface of substrate material 109 may be configured using solder jetting. For example there may be approximately 121 pieces of solder bumps on the readout IC 105 facing the sensor 101.

Figure 3:
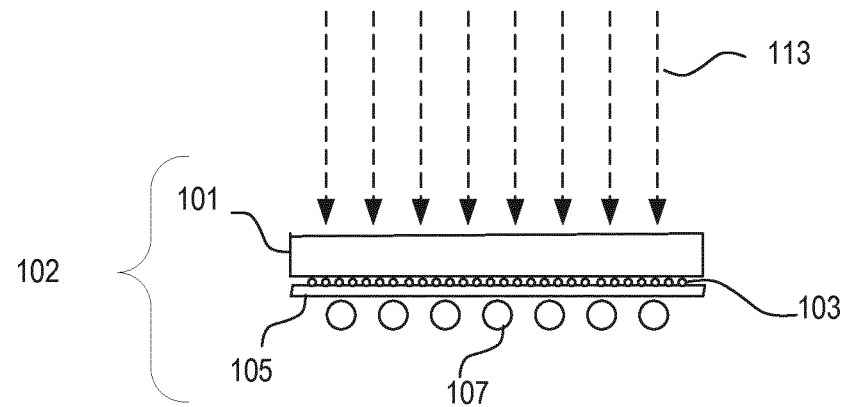
FIG. 3 illustrates a schematic representation of a step of configuring a direct conversion compound semiconductor sensor and a readout IC according to an embodiment.

FIG. 3 illustrates a schematic representation of a step of configuring a direct conversion compound semiconductor sensor 101 over a readout IC 105 and reflowing the solder to make electrical connections between the two, according to an embodiment. The direct conversion compound semiconductor sensor 101 comprises electrical connection sites, for example in the form of electrical pads, on its bottom surface, configured to transmit electrical signals produced by the high frequency incident and detected by it. The read out IC 105 is configured to receive these signals via electrical connection points on its top surface, digitize them and then forward the via electrical connection points on its bottom surface. Solder material 103 may be configured on the top surface of the readout IC 105, corresponding to the electrical connection points on the readout IC 105 and connectable to the electrical connection points on the bottom surface of direct conversion compound semiconductor sensor 101. Solder material 107 may also be configured on the bottom surface of the readout IC 105 corresponding to the electrical connection points on the bottom surface of the readout IC 105. The direct conversion compound semiconductor sensor 101 is positioned on top of the readout IC 105 such that the electrical connection points and the solder material 103 matches. Next the sensor may be bonded using a physical force applied on the direct conversion compound semiconductor sensor 101 and the readout IC 105 against each other. The force to be applied may be chosen considering the physical properties of the direct conversion compound semiconductor sensor 101 and the readout IC 105 such that it does not induce stress or cause damage in the direct conversion compound semiconductor sensor 101 and readout IC 105. The force to be applied may also be chosen such that a temporary physical adhesion between the solder material 103 and the direct conversion compound semiconductor sensor 101. An IR laser 113 with a frequency such that the direct conversion compound semiconductor sensor 101 and/or readout IC 105 is substantially transparent to it is then configured to illuminate the solder material 103. The illumination with the IR laser radiation 113 is timed so that it is long enough to melt and reflow the solder material 103, but short enough to not cause thermal damage to the direct conversion compound semiconductor sensor 101 and the readout IC 105. The reflow of the solder material 103 forms electrical connections between the electrical connection points on the bottom surface of the direct conversion compound semiconductor sensor 101 and the electrical connection points on the top surface of the readout IC 105.

According to an embodiment, the IR radiation 113 may be incident on the direct conversion compound semiconductor sensor 101 and may travel through the direct conversion compound semiconductor sensor 101 to illuminate the solder material 103. In such an embodiment, an IR laser (not shown in FIG. 3) may be configured perpendicular to and facing the direct conversion compound semiconductor sensor 101.

According to an embodiment, the IR radiation 113 may be incident on the readout IC 105 and may travel through the readout IC 105 to illuminate the solder material 103. In such an embodiment, an IR laser (not shown in FIG. 3) may be configured perpendicular to and facing the readout IC 105.

According to an embodiment, the solder material 103 or 107 may be configured on the readout IC 105 by using a jetting process, wherein a solder jetting apparatus places individual solder bumps, dots, strip lines or balls on the corresponding electrical connection points as by dispensing solder or solder paste in discrete flows. According to an embodiment, the jetting apparatus may use an IR laser to reflow the solder.

Figure 4:
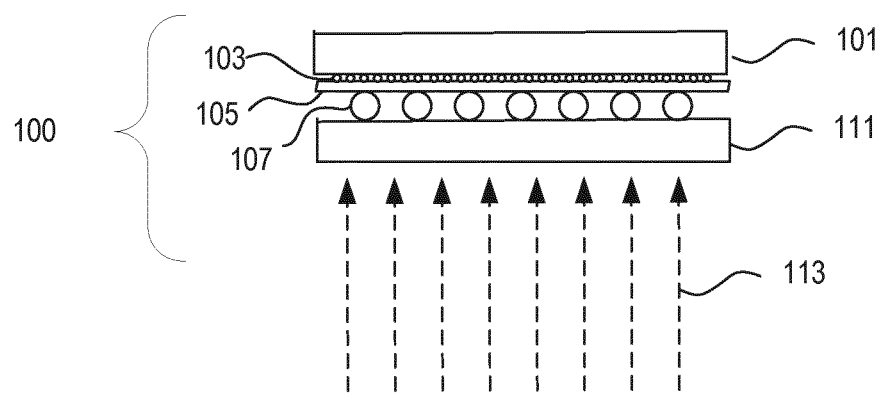
FIG. 4 illustrates a schematic representation of a step of configuring a substrate of a direct conversion compound semiconductor detector according to an embodiment.

FIG. 4 illustrates a schematic representation of configuring an assembly 100 comprising a direct conversion compound semiconductor sensor 101 and a readout IC 105, assembled according to embodiments of FIG. 3, on a substrate material 111 according to an embodiment. The substrate material 111 has electrical connection sites which are configured to take the output of readout IC 105 and forward it for, for example, further processing. The assembly 102, comprising the direct conversion compound semiconductor sensor 101 and the readout IC 105 assembled in embodiments of FIG. 3 may be placed over the substrate material 111, such that the balls, strip lines or lumps of solder material 107, which are configured on the bottom surface of readout IC 105, are positioned over the corresponding electrical connection points on the substrate material 111. The assembly 102 and substrate material 111 may be bonded for example by using a suitable physical force to secure the assembly 102 and the substrate material. IR laser radiation from an IR laser then illuminates the solder material 111 to reflow it to form electrical connections between the electrical connection points on the bottom surface of readout IC 105 and the electrical connection points on the top surface of the substrate material 111.

According to an embodiment, solder material 107 may be configured on substrate material 111 instead of readout IC 105.

According to some embodiments, substrate material 111 may be substantially transparent to IR laser radiation 113, and the IR laser may illuminate solder material 113 after passing through the substrate material 111. According to other embodiments, the IR laser radiation 113 may pass through the direct conversion compound semiconductor sensor 101 and readout IC 105 before illuminating the solder material 111.

Figure 5:
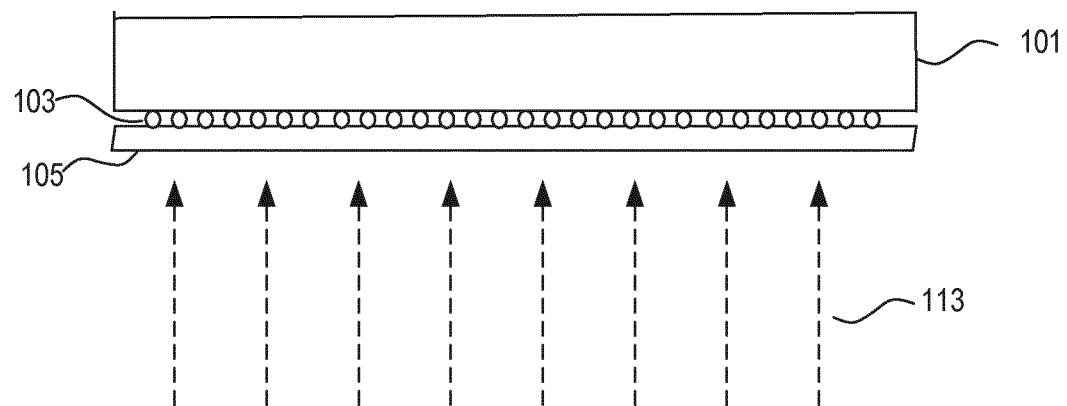
FIG. 5 illustrates a schematic representation of configuring a direct conversion compound semiconductor sensor and a readout IC according to another embodiment.
Figure 6:
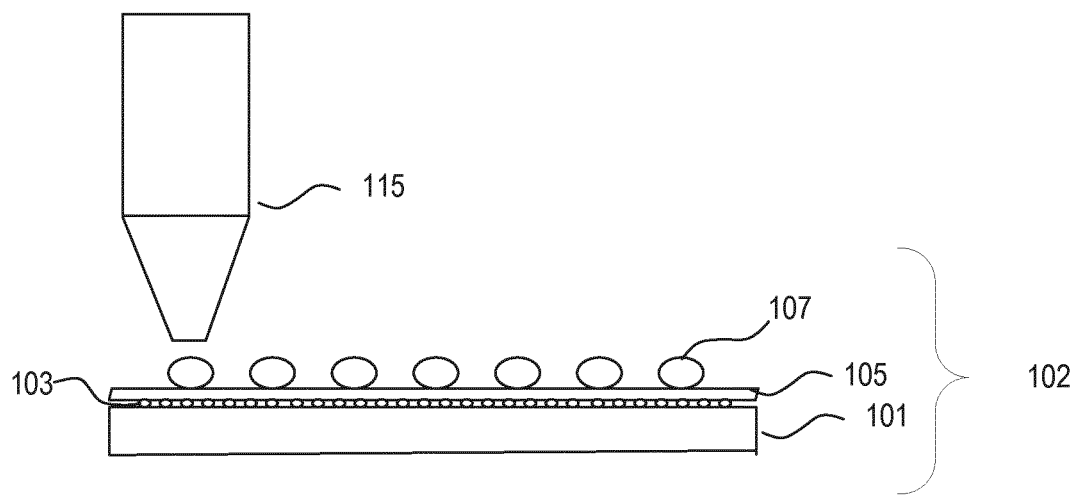
FIG. 6 illustrates a schematic representation of configuring solder balls on a readout IC according to an embodiment.
Figure 7:
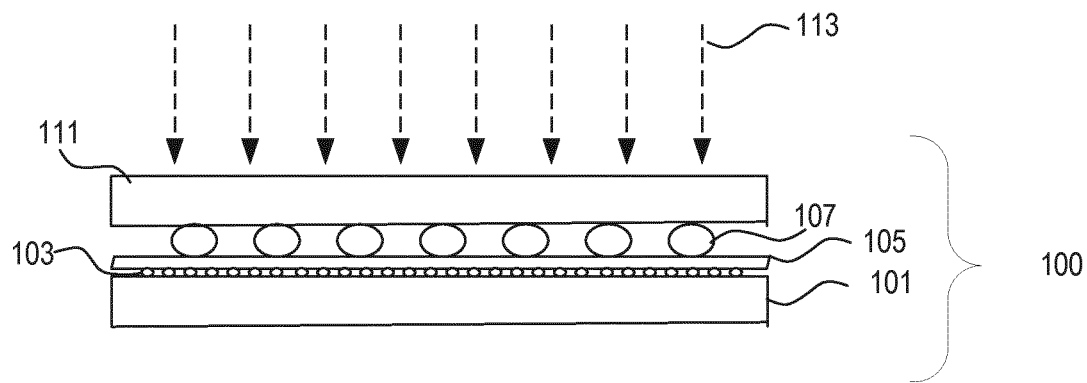
FIG. 7 illustrates a schematic representation of a step of configuring a substrate of a direct conversion compound semiconductor detector according to an embodiment.

FIGS. 5, 6 and 7 illustrate steps of assembly of a direct conversion compound semiconductor detector 100 according to another embodiment. The direct conversion compound semiconductor detector 100 comprises a direct conversion compound semiconductor sensor 101, configured over a readout IC 105 which is configured over a substrate material 111.

Referring to FIG. 5, a direct conversion compound semiconductor sensor 101 is configured over the top surface of a readout IC 105. The direct conversion compound semiconductor sensor 101 has electrical connection points on its bottom side to transmit electrical signals corresponding to high frequency incident on and detected by it. The readout IC 105 comprises electrical connection points on its top surface configured to receive the electrical signals from the direct conversion compound semiconductor sensor 101, circuitry to digitize the received electrical signals and electrical connection sites on its bottom surface to transmit the digitized signals. On the top surface of the readout IC 105, solder material 103, for example as lumps, spheres, strip lines or balls, may be configured over the electrical connection points, for example by jetting. IR radiation 113 from an IR laser (not shown in FIGS. 5, 6, and 7) illuminates the solder material 103 to reflow it so that electrical connection between electrical connection points on bottom surface of direct conversion compound semiconductor sensor 101 and top surface of readout IC 105 are formed. The frequency of IR laser is chosen such that readout IC 105 is substantially transparent to it. The duration of illumination by IR radiation 113 is chosen such that solder material 103 is reflowed, but the direct conversion compound semiconductor sensor 101 and the read out IC 105 is not thermally damaged.

Referring to FIG. 6, the assembly assembled in embodiments of FIG. 5 may be flipped such that the bottom surface of the readout IC 115 is on top. A jetting apparatus 115 then deposits solder material 103, for example solder paste or molten solder, on the electrical connection points on the bottom surface of the readout IC 105.

Referring to FIG. 7, a substrate material 111 comprising electrical connection points on its top surface to receive digitized signals from the readout IC is configured on top of the assembly 102 assembled in embodiments of FIGS. 5 and 6 such that the electrical connection points match the corresponding balls, strip lines, or lumps or spheres of solder material 107 on the readout IC. IR radiation 113 from an IR laser then illuminates the solder material 107 to reflow it and form electrical connections between the electrical connection points on top surface of the substrate material 111 and the electrical connection points on bottom surface of the readout IC 105.

Figure 8:
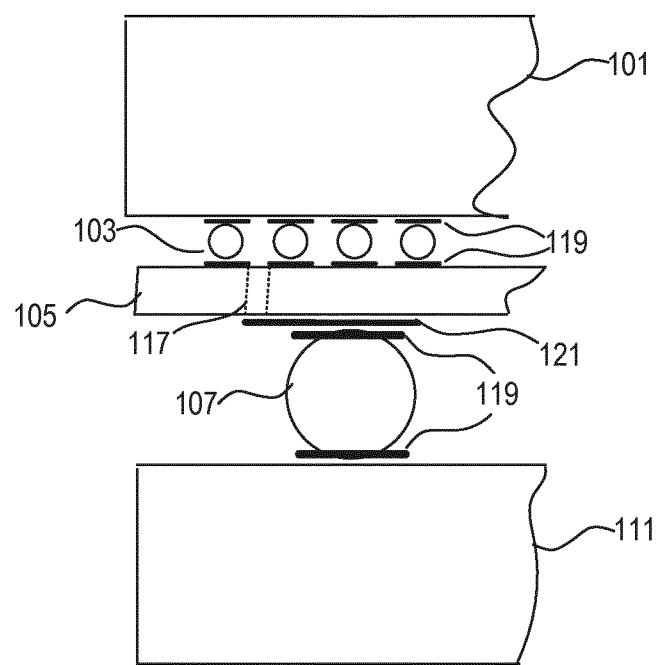
FIG. 8 illustrates a cross-sectional view of a portion of a complete direct conversion compound semiconductor detector assembled according to some embodiments.

FIG. 8 illustrates a cross-sectional view of a portion of a complete individual direct conversion compound semiconductor sensor detector 100 as assembled in embodiments of FIG. 1 to FIG. 8. The individual direct conversion compound semiconductor sensor detector 100 comprises a direct conversion compound semiconductor sensor 101, a readout IC 105, a substrate material 111, solder material 103, 107 and silicon through vias 117, conducing metal layer 121 for distribution and conductive pads 119 over electrical connection points of the direct conversion compound semiconductor sensor 101, readout IC 105 and substrate material 111.

Referring to FIG. 8, the direct conversion compound semiconductor sensor 101 is configured over the readout IC 105 and the readout IC 105 is configured over substrate material 111. The electrical connection points on the bottom surface of direct conversion compound semiconductor sensor 101, top and bottom surface of readout IC 105 and the top surface substrate layer 111 comprise conductive pads 119. The corresponding conductive pads between the bottom surface of direct conversion compound semiconductor sensor 101 and top surface of readout IC 105 are connected to each other via fine pitch solder reflowed by the IR radiation 113. The readout IC 105 comprises circuitry to digitize electrical signals received from the direct conversion compound semiconductor sensor 101. The circuitry is connected to the bottom surface of readout IC 105 by silicon through vias 117. On the bottom surface or readout IC, the connections are redistributed by, for example layers of conductive material 121 to connection pads 119 on bottom of the readout IC 105. The conductive pads 119 on bottom of readout IC are electrically connected to corresponding conductive pads on the top surface of substrate material by solder material 107. The solder material 107 may be in the form of a ball grid array.

In some embodiments, the solder material 103 and 107 may have a melting point higher than 150 degree Celsius. This may include solder materials standard lead free solder or eutectic SnPb solders.

According to an embodiment, multiple direct conversion compound semiconductor sensor detectors 100 may be arranged in a grid to form a detector array. An imaging apparatus may comprise such a detector array, a high frequency radiation source, for example an x-ray source and image processing means for example an image processor. An image processor may comprise a standard computer running specialized image processing software or application specific hardware or a mix of the two. Such an imaging apparatus may be used, for example for obtaining x-ray images of live biological tissue or non-biological items like luggage.

The methods and functionalities described herein may be performed by software in machine readable form on a tangible storage medium e.g. in the form of a computer program comprising computer program code means adapted to perform all the functions and the steps of any of the methods described herein when the program is run on a computer configured to control the necessary manufacturing equipment, for example robotic arms, and where the computer program may be embodied on a computer readable medium. Examples of tangible storage media include computer storage devices comprising computer-readable media such as disks, thumb drives, memory etc. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store, parts or all of, an example of the process described as software. A local or terminal computer may access the remote computer and download a part or all of the software to run the program. Alternatively, the local computer may download pieces of the software as needed, or execute some software instructions at the local terminal and some at the remote computer (or computer network). Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as embodiments of implementing the claims and other equivalent features and acts are intended to be within the scope of the claims.

According to an embodiment, a method, comprises: configuring a direct conversion compound semiconductor sensor over a first surface of a readout integrated circuit, IC, comprising two surfaces, each surface comprising solder material on the surface; illuminating the solder material with an infra-red laser such that the solder material on the readout IC melts and forms solder joints between the readout IC and the direct conversion compound semiconductor sensor; configuring a substrate over a second surface of the readout IC comprising solder material; and illuminating the solder material of the second surface with the infra-red laser such that the solder material on the readout IC melts and electrically connects the readout IC with the substrate.

Alternatively or in addition to the above, the direct conversion compound semiconductor sensor is configured over the first surface of the readout IC and radiation of the infra-red laser passes through the direct conversion compound semiconductor sensor before reaching the solder material on the first surface of the readout IC. Alternatively or in addition to the above, the substrate is configured over the second surface of the readout IC, and the radiation of the infra-red laser passes through the substrate before reaching the solder material on the second surface of the readout IC. Alternatively or in addition to the above, the direct conversion compound semiconductor sensor is configured over the first surface of the readout IC and radiation of the infra-red laser passes through the readout IC before reaching the solder material on the first surface of the readout IC. Alternatively or in addition to the above, the substrate is configured over the second surface of the readout IC, and the radiation of the infra-red laser passes through the substrate before reaching the solder material on the second surface of the readout IC. Alternatively or in addition to the above, a wavelength of the infra-red laser is chosen such that the direct conversion compound semiconductor sensor is substantially transparent to the infra-red laser. Alternatively or in addition to the above, the solder material is configured on the two surfaces of the readout IC by jetting. Alternatively or in addition to the above, the direct conversion compound semiconductor sensor is configured over the first surface of the readout IC by bonding, wherein the bonding comprises placing the direct conversion compound semiconductor sensor over the readout IC so that electrical contact points configured on the bottom surface of the direct conversion compound semiconductor sensor match with the solder material of the readout IC and applying a physical force on the direct conversion compound semiconductor sensor. Alternatively or in addition to the above, the physical force applied on the direct conversion compound semiconductor sensor is within the range 0 to 100 Newton substantially perpendicular to the surfaces of readout IC. Alternatively or in addition to the above, the direct conversion compound semiconductor sensor comprises Cadmium Telluride or Cadmium Zinc Telluride. Alternatively or in addition to the above, the solder alloy has a melting point higher than 150 degree Celsius.

According to an embodiment, a computer program comprises a program code configured to perform a method according to the above, when the computer program is executed on a computer controlling hardware required to perform the method.

According to an embodiment, a high frequency radiation detector, comprises: a direct conversion compound semiconductor sensor; a readout integrated circuit, IC, comprising a first surface and a second surface, the first surface having solder alloy configured on it and the second surface comprise solder alloy; and a substrate having a grid array, assembled by: configuring the direct conversion compound semiconductor sensor over the first surface of the readout IC; illuminating the solder alloy of the first surface with an infra-red laser such that the solder alloy configured on the readout IC melt and form solder joints between readout IC and the direct conversion compound semiconductor sensor; configuring the substrate over the second surface of the readout IC; and illuminating the solder alloy of the second surface with the infra-red laser such that the solder alloy configured on the readout IC melt and electrically connect the readout IC with the substrate.

Alternatively or in addition to the above, the direct conversion compound semiconductor sensor is configured over the first surface of the readout IC and radiation of the infra-red laser passes through the direct conversion compound semiconductor sensor before reaching the solder alloy on the first surface of the readout IC. Alternatively or in addition to the above, the direct conversion compound semiconductor sensor is configured over the first surface of the readout IC and radiation of the infra-red laser passes through the readout IC before reaching the solder bumps on the first surface of the readout IC.

According to an embodiment, an imaging apparatus comprises a radiation source, a detector array and an image processor, wherein the detector array comprises detectors, according to the above, arranged in a grid.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of embodiment only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A method, comprising:
configuring a direct conversion compound semiconductor sensor over a first surface of a readout integrated circuit (IC) comprising two surfaces, the first surface of the readout IC and a second surface of the readout IC, the first surface of the readout IC comprising a solder material on the first surface of the readout IC, and the second surface of the readout IC comprising a solder material on the second surface of the readout IC, wherein the direct conversion compound semiconductor sensor is configured over the first surface of the readout IC by bonding, wherein the bonding comprises placing the direct conversion compound semiconductor sensor over the readout IC so that electrical contact points configured on a bottom surface of the direct conversion compound semiconductor sensor match with the solder material on the first surface of the readout IC and applying a physical force on the direct conversion compound semiconductor sensor, and wherein the physical force applied on the direct conversion compound semiconductor sensor is such that a temporary physical adhesion between the solder material on the first surface of the readout IC and the direct conversion compound semiconductor sensor is configured;
illuminating the solder material on the first surface of the readout IC with an infra-red laser such that the solder material on the first surface of the readout IC melts and forms solder joints between the readout IC and the direct conversion compound semiconductor sensor;
configuring a substrate over the second surface of the readout IC;
and illuminating the solder material on the second surface of the readout IC with the infra-red laser such that the solder material on the second surface of the readout IC melts and electrically connects the readout IC with the substrate; and
wherein the solder material on the first surface of the readout IC and the solder material on the second surface of the readout IC comprises an electronic industry standard high temperature solder alloy.

2. The method of claim 1, wherein the direct conversion compound semiconductor sensor is configured over the first surface of the readout IC and radiation of the infra-red laser passes through the direct conversion compound semiconductor sensor before reaching the solder material on the first surface of the readout IC.

3. The method of claim 1, wherein the substrate is configured over the second surface of the readout IC, and the radiation of the infra-red laser passes through the substrate before reaching the solder material on the second surface of the readout IC.

4. The method of claim 1, wherein the direct conversion compound semiconductor sensor is configured over the first surface of the readout IC and radiation of the infra-red laser passes through the readout IC before reaching the solder material on the first surface of the readout IC.

5. The method of claim 1, wherein a wavelength of the infra-red laser is chosen such that the direct conversion compound semiconductor sensor is substantially transparent to the infra-red laser.

6. The method of claim 1, wherein the solder material on the first surface of the readout IC and on the second surface of the readout IC is configured on the two surfaces of the readout IC by jetting.

7. The method of claim 1, wherein the direct conversion compound semiconductor sensor comprises Cadmium Telluride or Cadmium Zinc Telluride.

8. The method of claim 1, wherein the electronic industry standard high temperature solder alloy comprises Sn—Ag—Cu alloy, standard lead free solder, or eutectic SnPb solder.

9. A computer program comprising a program code configured to perform a method according to claim 1, when the computer program is executed on a computer controlling hardware required to perform the method.

* * * * *